Figure 1:
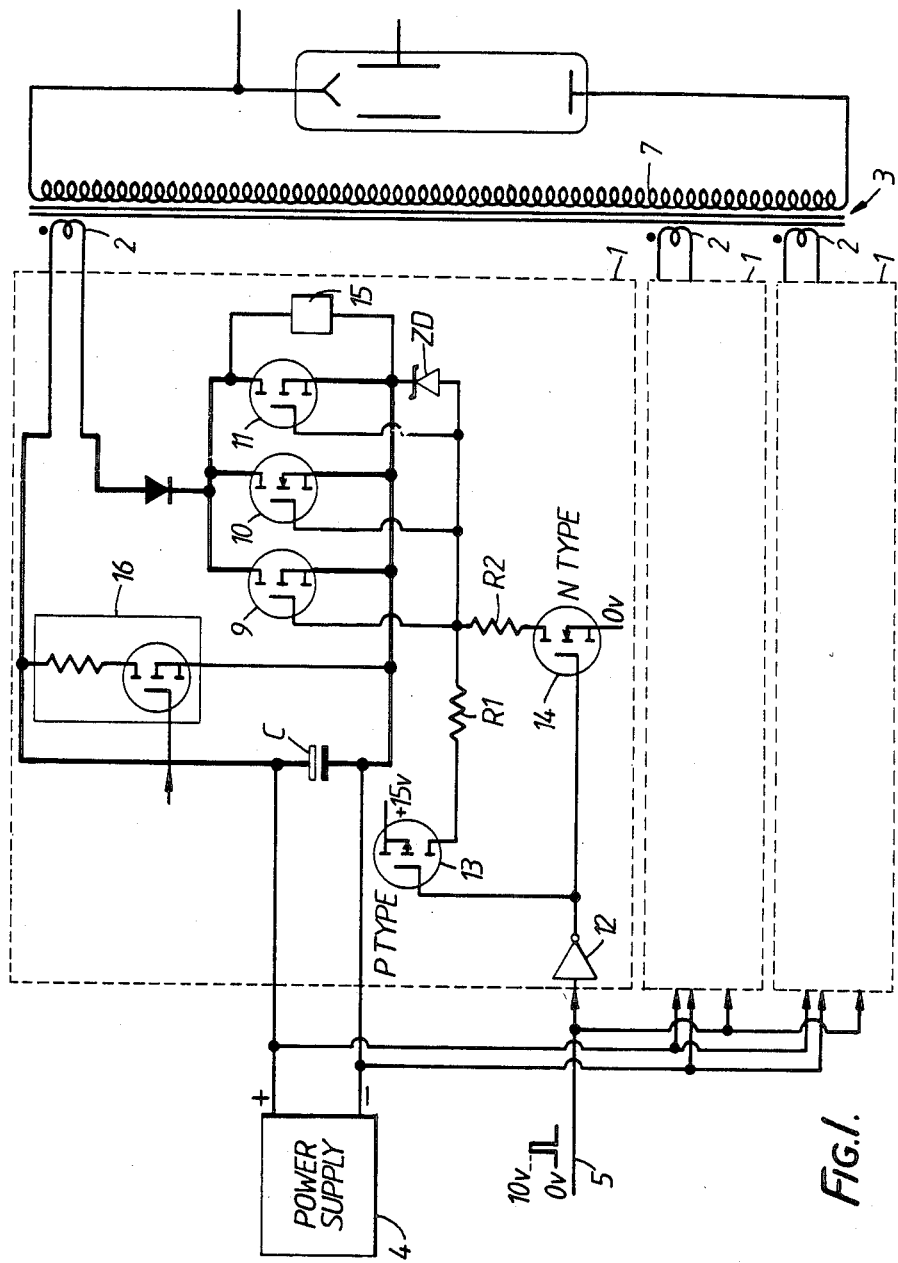

United States Patent [19]

Barker et al.

[11] Patent Number: 4,704,543

[45] Date of Patent: Nov. 3, 1987

[54] PULSE GENERATOR

[75] Inventors: Antony T. Barker; Simon C. Giles, both of Chelmsford; Robert Richardon, Ferres, all of United Kingdom

[73] Assignee: Marconi Company Limited, Chelmsford, England

[21] Appl. No.: 770,960

[22] Filed: Aug. 30, 1985

[30] Foreign Application Priority Data

Sep. 1, 1984 [GB] United Kingdom ............... 8422128
Sep. 1, 1984 [GB] United Kingdom ............... 8422126
Oct. 26, 1984 [GB] United Kingdom ............... 8427100

[51] Int. Cl.$^4$ .................................. H03K 3/00
[52] U.S. Cl. ............................. 307/106; 332/5
[58] Field of Search ............... 307/106, 108; 343/7.7, 343/17.10 R, 17.7; 363/59, 60; 332/5

[56] References Cited

U.S. PATENT DOCUMENTS

| 3,878,449 | 4/1975 | Wilhelm et al. | 307/108 |
| 3,980,895 | 9/1976 | Schrader | 307/106 |
| 4,050,004 | 9/1977 | Greatbach | 363/59 |
| 4,058,810 | 11/1977 | Bryden | 343/17.1 R |
| 4,079,265 | 3/1978 | Woodburn | 307/108 |
| 4,179,728 | 12/1979 | Pirkle | 363/59 |
| 4,442,362 | 4/1984 | Rao | 307/108 |

FOREIGN PATENT DOCUMENTS 1255744 12/1971 United Kingdom .
2090492  5/1984 United Kingdom .

OTHER PUBLICATIONS

"VFET Applications", Electronics Today International, 12/79, pp. 25-30.
"MOSFET's Rise to New Levels of Power", Electronics, 5/22/80, R. Severns, pp. 143-152.

Primary Examiner—Vit W. Miska
Attorney, Agent, or Firm—Spencer & Frank

[57] ABSTRACT

A plurality of solid state switching devices, connected in parallel, are switched simultaneously to discharge a capacitor through the primary of a step-up transformer whose secondary is connected to the output type of a radar transmitter.

3 Claims, 2 Drawing Figures

PULSE GENERATOR

This invention relates to a pulse generator for supplying pulses to the output tube of a radar transmitter.

Conventionally, in such pulse generators, a high voltage D.C. supply sometimes greater than 20 Kv is employed to charge a capacitor which is then discharged through the output tube by triggering a switch in the form of another vacuum tube device. In such conventional systems a number of specialised and costly high voltage components are required and the circuit suffers to a certain degree from inherent unreliability and limited lifetime of the vacuum tube switching device. Furthermore sophisticated protection devices are needed to short circuit the capacitor in the event of arcing within the output tube of the transmitter.

In its broadest aspect this invention provides a pulse generator for supplying pulses to the output tube of a radar transmitter comprising a voltage step-up transformer whose secondary is connected to the output tube, an energy store, and a plurality of solid state switching devices connected in parallel and arranged to be switched simultaneously so as to allow the energy store to at least partially discharge through the transformer primary.

By employing solid state switching devices in this way, the inherent unreliability of the vacuum tube can be eliminated. The use of a parallel arrangement of solid state switching devices enables a very high current pulse to be generated, thereby supplying the required power despite the limited voltage handling capabilities of solid state devices. Having achieved a pulse of the required power the transformer deals with the production of the required voltage. The arrangement of the invention also leads to some unexpected advantages. Because the use of semiconductor devices imposes the requirement to perform the switching operation at low voltage, the need for high voltage components and their attendant disadvantages is eliminated. Also the low voltage switching circuitry can be built much more compactly and with a smaller weight which is important particularly for ship's or airbourne radars.

To achieve the required power it may be desirable in some circumstances to include a number of pulse generators each feeding an individual primary of the transformer and each arranged to be switched in unison so as to produce an additive effect in the secondary winding of the transformer. The provision of such a plurality of pulse generators can be advantageous even in cases where the features of the invention as previously defined are not employed. Thus, according to a second aspect of the invention there is provided a modulator for a radar transmitter comprising a voltage step-up transformer having a number of primary windings and an equal number of solid state switching devices each arranged to switch simultaneous pulses of current to an associated primary to produce an additive effect resulting in a single high voltage pulse at an output of a secondary of the transformer, the secondary being connected to an output tube of the transmitter. By employing this aspect of the invention the advantages of good life expectation and reliability associated with solid state switches can be obtained in contrast with the use of a conventional gas or vacuum tube switch. Secondly, because each switching device has its own transformer primary, a malfunction in one of them will not effect satisfactory operation of the others and the transmitter will continue to operate though at slightly reduced power.

A control electrode of each switching device is preferably connected to some voltage limiting device which prevents the voltage of the control electrode from exceeding a given value. This voltage limiting device is of particular advantage where, as is preferred, the switching devices are field effect transistors (FETs). This is because an abnormally high dv/dt applied across the FET can induce an increased voltage on the control electrode resulting in a very high current passing through, and possibly damaging the FET. This situation can occur if, as sometimes happens, the output tube arcs. If transistors rather than FETs are used they can be arranged to enter a current limiting mode when arcing in the output tube occurs.

Figure 2:
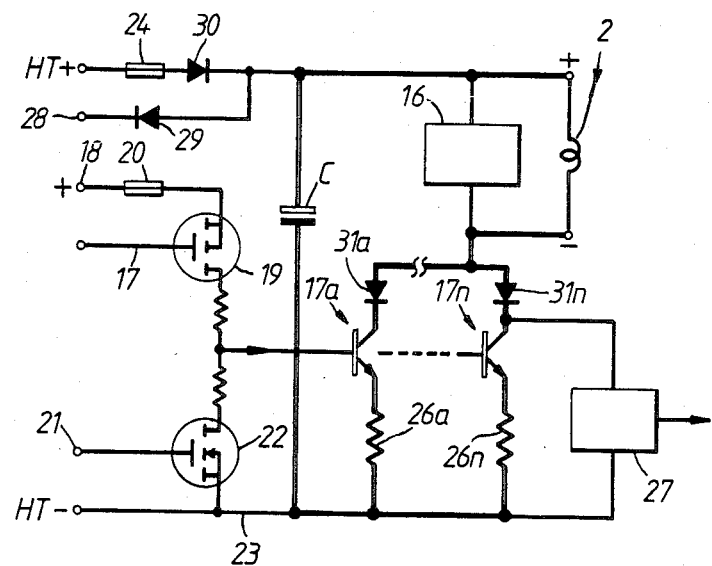

Two ways in which the invention may be performed will now be described by way of example with reference to the accompanying drawings in which:

FIG. 1 illustrates three pulse generators (each constructed in accordance with the invention and employing FET switching devices, the thick lines denoting a low inductance circuit) the three pulse generators being connected via a transformer to a microwave tube forming the output stage of a radar transmitter; and FIG. 2 illustrates a similar pulse generator employing transistors as switches the thick lines again denoting a low inductance circuit.

FIG. 1 shows three pulse generators, 1 each constructed in accordance with the invention and connected to respective primarys 2 of a transformer 3. The pulse generators 1 are powered from a common power supply 4 and receive the same trigger signals on line 5. The secondary 7 of the transformer is connected to a microwave generator in the form of a tube 8. Only one pulse generator 1 is shown in detail, since they are all identical, and this will now be described.

Referring to FIG. 1, the FET switches 9, 10 and 11 are connected in parallel in a series circuit including a capacitor C and one primary 2 of the voltage step-up transformer 3.

A control pulse on line 5 is illustrated on FIG. 1 and passes through an invertor 12. The resulting inverted pulse switches on a F type FET 13 which turns on the FETs 9, 10 and 11 through a current limiting resistor R1. In practice many more FETs than the three illustrated may be included at the same time as P type FET 13 is turned on, an N type FET 14 is turned off, allowing the pulse from FET 13 to turn on the FETs 9, 10 and 11.

When the voltage on line 5 is at zero. i.e., between pulses, the P type FET 13 is off and the N type FET 14 is on, thereby connecting the control electrodes of FETs 9, 10 and 11 to zero volts through resistor R2. This allows FETs 9, 10 and 11 to turn off rapidly at the end of each pulse and prevents them from being spuriously triggered between pulses.

When the FET switches 9, 10 and 11 are switched on, capacitor 4 is presented across the transformer primary thereby producing a high voltage at its secondary which drives the output tube of the transmitter. The capacitor C is "topped up" during the radar interpulse period by the power supply 4.

It is notable that this modulator only requires one drive pulse since the inverting amplifier 14 is automatically turned off during the pulse duration and the non-inverting amplifier 13 is turned off during the interpulse period.

An energy diverter 15 is included to leak away energy stored in the capacitor C. This is triggered either from an external signal or by a signal from a fault count circuit which will allow a given number, say eight, pulse generator short circuit current pulses before tripping. The diverter is not latching so it can be turned on and off actively.

Snubber and voltage clamp circuit 15 is included to ensure that the voltage across the FETs does not exceed a safe value and that the turn off dv/dt does not exceed the rated value for the FET switch.

In the event of an unusually high dv/dt occurring across the FETs an increase in the control electrode voltage can result, leading to high current passing through and damaging the FETs. This situation is prevented by a Zener diode ZD which prevents the voltage of the control electrode from exceeding a given value.

An alternative pulse generator for use instead of that shown at 1 on FIG. 1 is shown in FIG. 2 where similar reference numerals are used to denote similar components. In this embodiment a number of bi-polar transistor switches 17a to 17n are connected in parallel. They conduct for as long as an "on" signal is present on line 17 thereby switching a low voltage positive supply 18 via switch 19 and fuse 20 to the transistor bases. To turn off the transistors the "on" signal is removed and an "off" signal applied to terminal 21 to operate switch 22 thereby connecting the transistor bases to the zero volt rail 23.

The transistors are operated out of the saturation region to minimise hole storage which would be observed as a delay to the pulse turn-off resulting in a longer pulse than required.

A component failure will result in either the HT fuse 24 or the low tension fuse 20 operating. The input signal lines are isolated should the low tension fuse open. Therefore, in a system, such as is envisaged, where a number of identical circuits are used to energise a single transmitter tube via different primaries, like that shown at 1, of the transformer 3, should one circuit fail, the remaining circuits will continue unaffected.

If shorted or arcing load occurs the transistor switches are protected by entering a current limiting mode. The current gain is limited by the value of emitter resistors 26a to 26n since a constant base drive is used and the transistors can tolerate the small increase in current for a period of a number of pulses, allowing time for a missing pulse detector 27 to trigger a crowbar circuit (not shown) connected to terminal 28. The crowbar in this case is a slow acting energy diverter which discharges capacitor C via diode 29. Diode 30 protects fuse 24 from the crowbar current.

The diodes 31a to 31n serve to isolate any pulse generator from the pulse transformer 6 should one or more of the output switching devices fail. By this means the failure of one pulse generator does not adversely affect the system performance.

In a modified arrangement an additional spare switching device is included and means is provided for detecting a fault in one of the other switching devices and for switching the spare into operation in response to such a detection. The detection of the fault can simply be by the detection of high tension at the transistors. In the event of such a detection a central control unit sends a command to shut down the faulty module automatically whilst a replacement is switched into place. The replacement module would be connected to an additional primary circuit of the transformer not normally used.

We claim:

1. A modulator for a radar transmitter comprising a voltage step-up transformer having a number of primary windings and an equal number of solid state switching devices each arranged to switch simultaneous pulses of current to an associated primary to produce an additive effect resulting in a single high voltage pulse at a output of a secondary of the transformer, the secondary being connected to the output tube of the transmitter.

2. A pulse generator according to claim 1 in which a control electrode of the switching devices is connected to a voltage limiting device which prevents its voltage exceeding a critical value in the event of arcing in the output tube.

3. A pulse generator according to claim 1 in which the switching devices are field effect transistors.

* * * * *